(12) United States Patent
Luo

(10) Patent No.: US 12,238,902 B2
(45) Date of Patent: Feb. 25, 2025

(54) REFRIGERATION SYSTEM FOR DATA CENTER

(71) Applicant: BEIJING BAIDU NETCOM SCIENCE TECHNOLOGY CO., LTD., Beijing (CN)

(72) Inventor: Zhiming Luo, Beijing (CN)

(73) Assignee: BEIJING BAIDU NETCOM SCIENCE TECHNOLOGY CO., LTD., Beijing (CN)

( * ) Notice: Subject to any disclaimer, the term of this patent is extended or adjusted under 35 U.S.C. 154(b) by 290 days.

(21) Appl. No.: 17/814,625

(22) Filed: Jul. 25, 2022

(65) Prior Publication Data

US 2022/0361379 A1    Nov. 10, 2022

(30) Foreign Application Priority Data

Dec. 28, 2021  (CN) .......................... 202111629810.X
Dec. 28, 2021  (CN) .......................... 202123362735.3

(51) Int. Cl.
   *H05K 7/20* (2006.01)
(52) U.S. Cl.
   CPC ..... *H05K 7/20827* (2013.01); *H05K 7/20309* (2013.01); *H05K 7/20318* (2013.01); *H05K 7/20327* (2013.01); *H05K 7/20354* (2013.01)
(58) Field of Classification Search
   CPC .......... H05K 7/20354; H05K 7/20327; H05K 7/20318; H05K 7/20309; H05K 7/20827
   See application file for complete search history.

(56) References Cited

FOREIGN PATENT DOCUMENTS

| CN | 111550953 A | * | 8/2020 | ............. F25B 31/02 |
| CN | 111565546 A | * | 8/2020 | |

OTHER PUBLICATIONS

Office Action issued for Chinese patent application No. 202111629810.X, mailed Jun. 16, 2023 (18 pages).

* cited by examiner

*Primary Examiner* — Ana M Vazquez
(74) *Attorney, Agent, or Firm* — Osha Bergman Watanabe & Burton LLP

(57) ABSTRACT

A refrigeration system for a data center includes an indoor module, a main outdoor heat-dissipation module and an auxiliary outdoor heat-dissipation module, inlets of the first compressor and the second compressor are respectively connected to an outlet of the indoor module, outlets of the first compressor and the second compressor are respectively connected to a gaseous refrigerant inlet of the first condenser, liquid refrigerant outlets of the first condenser and the second condenser are respectively connected to an inlet of the indoor module, in which a refrigeration cycle passage for the data center is formed by the indoor module, the first condenser and the first compressor when the main outdoor heat-dissipation module is in a normal condition, and the refrigeration cycle passage for the data center is formed by the indoor module, the second condenser and the second compressor when the main outdoor heat-dissipation module fails.

10 Claims, 2 Drawing Sheets

REFRIGERATION SYSTEM FOR DATA CENTER

CROSS-REFERENCE TO RELATED APPLICATIONS

The present application claims the benefit of priority to Chinese Applications No. 202111629810.X and 202123362735.3, filed on Dec. 28, 2021, the contents of which are incorporated herein by reference in their entireties for all purposes.

FIELD

The present disclosure relates to a field of refrigeration for data centers, and more particularly to a refrigeration system for a data center.

BACKGROUND

With the development of Internet technology, the demand for data centers has increased in recent years. At present, the refrigeration system for the data center adopts the traditional chilled water system, but the traditional chilled water system has high energy consumption and poor energy saving.

SUMMARY

According to an aspect of the present disclosure, there is provided a refrigeration system for a data center, the data center includes a cabinet in a room thereof, and the refrigeration system includes: an indoor module; a main outdoor heat-dissipation module including a first condenser and a first compressor, in which an inlet of the first compressor is connected to an outlet of the indoor module, an outlet of the first compressor is connected to a gaseous refrigerant inlet of the first condenser, and a liquid refrigerant outlet of the first condenser is connected to an inlet of the indoor module; an auxiliary outdoor heat-dissipation module including a second condenser and a second compressor, in which an inlet of the second compressor is connected to the outlet of the indoor module, an outlet of the second compressor is connected to a gaseous refrigerant inlet of the second condenser, and a liquid refrigerant outlet of the second condenser is connected to the inlet of the indoor module. A refrigeration cycle passage for the data center is formed by the indoor module, the first condenser and the first compressor when the main outdoor heat-dissipation module is in a normal condition. The refrigeration cycle passage for the data center is formed by the indoor module, the second condenser and the second compressor when the main outdoor heat-dissipation module fails.

It should be understood that the descriptions herein are not intended to identify key or critical features of the embodiments of the present disclosure or to limit the scope of the present disclosure. Other features of the present disclosure will become readily apparent from the following descriptions.

BRIEF DESCRIPTION OF THE DRAWINGS

The drawings are intended to provide a better understanding of the present disclosure and not to be construed as a limitation to the present disclosure.

DETAILED DESCRIPTION

The exemplary embodiments of the present disclosure are described with reference to the accompanying drawings in the following, in which various details of the embodiments of the present disclosure are included to facilitate understanding and should be construed as exemplary only. Accordingly, those ordinary skilled in the related art will recognize that various changes and modifications may be made to the embodiments described herein without departing from the scope and spirit of the present disclosure. Also, descriptions of well-known functions and structures are omitted in the following for clarity and conciseness.

A refrigeration system for a data center according to an embodiment of the present disclosure will be described with reference to the accompanying drawings in the following.

Before describing the refrigeration system for the data center according to the embodiment of the present disclosure, a traditional chilled water system for the data center will be described first.

Figure 1:
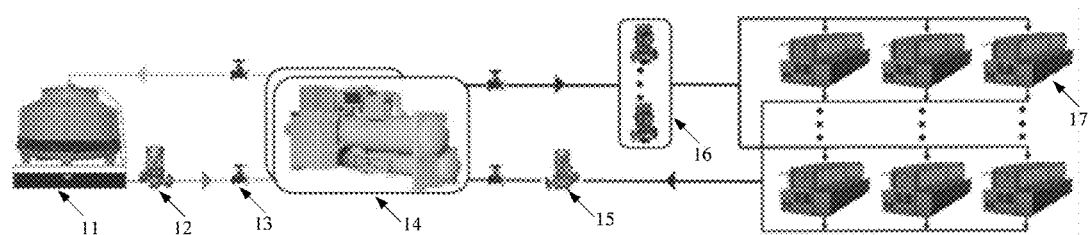
FIG. 1 is a schematic view of a chilled water system in the related art.

FIG. 1 is a schematic view of a chilled water system in the related art.

As shown in FIG. 1, the chilled water system in the related art includes a cooling tower 11, a cooling pump 12, a shut-off valve 13, a water chilling unit 14, a primary pump 15, a secondary pump 16 and a heat exchange terminal 17.

A water outlet of the cooling tower 11 is connected to a first end of the water chilling unit 14 via the cooling pump 12 and the shut-off valve 13 in sequence, a second end of the water chilling unit 14 is connected to a water inlet of the cooling tower 11 via the shut-off valve 13, a third end of the water chilling unit 14 is connected to one end of the heat exchange terminal 17 via the shut-off valve 13 and the primary pump 15 in sequence, and the other end of the heat exchange terminal 17 is connected to a fourth end of the water chilling unit 14 via the secondary pump 16 and the shut-off valve 13 in sequence.

It should be noted that when the chilled water system is required to cool the data center, the four shut-off valves 13 are controlled to open, and the cooling pump 12, the primary pump 15 and the secondary pump 16 are controlled to operate.

The chilled water system in the related art has a following operating principle.

A liquid water is cooled by the water chilling unit 14, the liquid chilled water cooled by the water chilling unit 14 is sent to the heat exchange terminal 17 via the secondary pump 16, the data center is cooled by a return air cooling, the liquid chilled water is changed into a gaseous water after cooling the data center, and the gaseous water is sent to the water chilling unit 14 via the third end of the water chilling unit 14 through the primary pump 15.

A cooling water in the cooling tower 11 flows into the water chilling unit 14 via the first end of the water chilling unit 14 through the cooling pump 12, so as to send the heat generated by the water chilling unit 14 to the cooling tower 11 through the first end of the water chilling unit 14, and the cooling tower 11 is cooled by an outdoor wind (namely, transferring the heat to the atmosphere), so that the cooling tower 11 provides the cooling water circularly and continuously.

Thus, the data center can be cooled by the chilled water system in the related art, but the chilled water system in the related art has high energy consumption and poor energy saving. In addition, the chilled water system in the related art cannot continue refrigeration when an outdoor heat-dissipation module fails.

To this end, the present disclosure proposes a new refrigeration system for the data center, which can achieve continuous refrigeration of the system, reduce energy consumption of the system and improve energy saving of the system.

Figure 2:
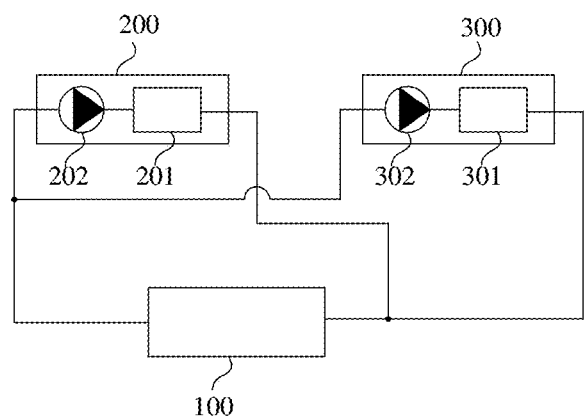
FIG. 2 is a schematic view of a refrigeration system for a data center according to an embodiment of the present disclosure.

FIG. 2 is a schematic view of a refrigeration system for a data center according to an embodiment of the present disclosure.

It should be noted that the data center includes at least one cabinet in a room thereof.

As shown in FIG. 2, the refrigeration system for the data center according to the embodiment of the present disclosure includes: an indoor module 100, a main outdoor heat-dissipation module 200 and an auxiliary outdoor heat-dissipation module 300.

The main outdoor heat-dissipation module 200 includes a first condenser 201 and a first compressor 202, an inlet of the first compressor 202 is connected to an outlet of the indoor module 100, an outlet of the first compressor 202 is connected to a gaseous refrigerant inlet of the first condenser 201, and a liquid refrigerant outlet of the first condenser 201 is connected to an inlet of the indoor module 100. The auxiliary outdoor heat-dissipation module 300 includes a second condenser 301 and a second compressor 302, an inlet of the second compressor 302 is connected to the outlet of the indoor module 100, an outlet of the second compressor 302 is connected to a gaseous refrigerant inlet of the second condenser 301, and a liquid refrigerant outlet of the second condenser 301 is connected to the inlet of the indoor module 100.

When the main outdoor heat-dissipation module 200 is in a normal condition, a refrigeration cycle passage for the data center is formed by the indoor module 100, the first condenser 201 and the first compressor 202. When the main outdoor heat-dissipation module 200 fails, the refrigeration cycle passage for the data center is formed by the indoor module 100, the second condenser 301 and the second compressor 302.

It should be noted that the first condenser 201 and the second condenser 301 of the embodiment of the present disclosure may employ an evaporative condenser, and the evaporative condenser is an apparatus for gradually cooling the refrigerant in a coil from a gaseous state to a liquid state by absorbing heat of the high-temperature gaseous refrigerant in the coil by means of partially evaporating a spray water outside the coil.

In this embodiment, when the refrigeration system operates normally, the main outdoor heat-dissipation module 200 operates and the auxiliary outdoor heat-dissipation module 300 is standby. At this time, the first compressor 202 allows the gaseous refrigerant to flow from the outlet of the first compressor 202 to the first condenser 201, the first condenser cools the gaseous refrigerant so as to convert the gaseous refrigerant into the liquid refrigerant (for example, the gaseous refrigerant in the coil of the first condenser 201 performs a phase change heat exchange with the spray water, and then the gaseous refrigerant changes into the liquid refrigerant), the liquid refrigerant flows to the indoor module 100, the liquid refrigerant in the indoor module 100 performs a phase change heat exchange with the cabinet to be cooled in the room of the data center, so as to reduce the temperature of the cabinet to be cooled in the room of the data center, and the refrigerant flowing out of the indoor module 100 changes from the liquid state to the gaseous state and flows back to the first compressor 202, which is sequentially circulated.

When the main outdoor heat-dissipation module 200 fails, the failed outdoor heat-dissipation module 200 stops, the indoor module 100 continues operating and the auxiliary outdoor heat-dissipation module 300 is switched to operate. The time required for the auxiliary outdoor heat-dissipation module 300 to be switched to start is about 2 minutes, and then the auxiliary outdoor heat-dissipation module 300 performs refrigeration. At this time, the failed outdoor heat-dissipation module 200 can be repaired. The second compressor 302 allows the gaseous refrigerant to flow from the outlet of the second compressor 302 to the second condenser 301, the second condenser cools the gaseous refrigerant so as to convert the gaseous refrigerant into the liquid refrigerant (for example, the gaseous refrigerant in the coil of the second condenser 301 performs the phase change heat exchange with the spray water, and then the gaseous refrigerant changes into the liquid refrigerant), the liquid refrigerant flows to the indoor module 100, the liquid refrigerant in the indoor module 100 performs the phase change heat exchange with the cabinet to be cooled in the room of the data center, so as to reduce the temperature of the cabinet to be cooled in the room of the data center, and the refrigerant flowing out of the indoor module 100 changes from the liquid state to the gaseous state and flows back to the second compressor 302, which is sequentially circulated. In this way, it can be ensured that the cabinet to be cooled in the room of the data center has no hot spots, thus achieving the continuous cooling of the system.

It should be noted that, for convenience of explanations, in FIG. 1 of the above embodiment, the indoor module 100 is only described as one indoor module 100, the main outdoor heat-dissipation module 200 is only described as including one first condenser 201 and one first compressor 202, and the auxiliary outdoor heat-dissipation module 300 is only described as including one second condenser 301 and one second compressor 302, as an example.

In other embodiments of the present disclosure, the indoor module 100, the main outdoor heat-dissipation module 200, and the auxiliary outdoor heat-dissipation module 300 may include more than one.

Figure 3:
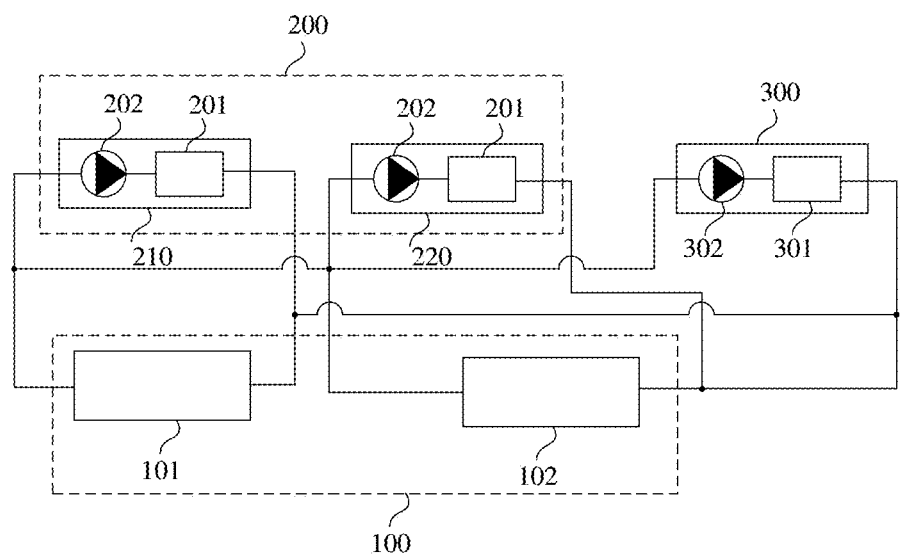
FIG. 3 is a schematic view of a refrigeration system for a data center according to another embodiment of the present disclosure.

For example, as shown in FIG. 3, the indoor module 100 includes a first indoor module 101 and a second indoor module 102. The main outdoor heat-dissipation module 200 includes a first main outdoor heat-dissipation module 210 including the first condenser 201 and the first compressor 202 and a second main outdoor heat-dissipation module 220 including the first condenser 201 and the first compressor 202. The auxiliary outdoor heat-dissipation module 300 includes one second condenser 301 and one second compressor 302.

The inlet of the first compressor 202 of the first main outdoor heat-dissipation module 210 is connected to an outlet of the first indoor module 101, the outlet of the first compressor 202 of the first main outdoor heat-dissipation module 210 is connected to the gaseous refrigerant inlet of the first condenser 201 of the first main outdoor heat-dissipation module 210, and the liquid refrigerant outlet of the first condenser 201 of the first main outdoor heat-dissipation module 210 is connected to an inlet of the first indoor module 101. The inlet of the second compressor 302 of the auxiliary outdoor heat-dissipation module 300 is respectively connected to the outlet of the first indoor module 101 and an outlet of the second indoor module 102, the outlet of the second compressor 302 of the auxiliary outdoor heat-dissipation module 300 is connected to the gaseous refrigerant inlet of the second condenser 301, and the liquid refrigerant outlet of the first condenser 201 of the second main outdoor heat-dissipation module 220 is connected to an inlet of the second indoor module 102.

The first condenser 201 of the first main outdoor heat-dissipation module 210, the first condenser 201 of the second main outdoor heat-dissipation module 220 and the second condenser 301 of the auxiliary outdoor heat-dissipation module 300 can also adopt an evaporative condenser.

When the first main outdoor heat-dissipation module 210 and the second main outdoor heat-dissipation module 220 are both in the normal condition, the refrigeration cycle passages for the data center are formed by the first indoor module 101, the first condenser 201 and the first compressor 202 of the first main outdoor heat-dissipation module 210, and by the second indoor module 102, the first condenser 201 and the first compressor 202 of the second main outdoor heat-dissipation module 220, respectively.

When the first main outdoor heat-dissipation module 210 fails, the refrigeration cycle passage for the data center is formed by the first indoor module 101, the second condenser 301, the second compressor 302, the second indoor module 102, the first condenser 201 and the first compressor 202 of the second main outdoor heat-dissipation module 220. Or, when the second outdoor heat-dissipation module 220 fails, the refrigeration cycle passage for the data center is formed by the first indoor module 101, the first condenser 201 and the first compressor 202 of the first outdoor heat-dissipation module 210, the second indoor module 102, the second condenser 301 and the second compressor 302.

It should be noted that when the number of the indoor modules 100 is less than or equal to 6, one auxiliary outdoor heat-dissipation module 300 may be provided; when the number of the indoor modules 100 is greater than 6 and less than or equal to 12, two auxiliary outdoor heat-dissipation modules 300 may be provided, in which one end of each auxiliary outdoor heat-dissipation module 300 (the inlet of the second compressor 302 of each auxiliary outdoor heat-dissipation module 300) is connected to the outlets of all the indoor modules 100, and the other end of each auxiliary outdoor heat-dissipation module 300 (the liquid refrigerant outlet of the second condenser 301 of each auxiliary outdoor heat-dissipation module 300) is connected to the inlets of all the indoor modules 100; when the number of the indoor modules 100 is greater than 12, a larger number of the auxiliary outdoor heat-dissipation modules 300 may be provided, and the specific number can be selected according to actual situations.

Thus, in the refrigeration system for the data center according to the embodiment of the present disclosure, the auxiliary outdoor heat-dissipation module is provided, the main outdoor heat-dissipation module includes the first compressor and the first condenser, the auxiliary outdoor heat-dissipation module includes the second compressor and the second condenser, so that the refrigeration cycle passage for the data center is formed by the indoor module, the first condenser and the first compressor when the main outdoor heat-dissipation module is in the normal condition, and the refrigeration cycle passage for the data center is formed by the indoor module, the second condenser and the second compressor when the main outdoor heat-dissipation module fails. Thus, the refrigeration system for the data center of the present disclosure can achieve the continuous refrigeration of the system, reduce the energy consumption of the system and improve the energy saving of the system.

Since the compressor has an oil return restriction, the pipe length and the height difference needs to be considered, so that the deployment scenario is limited, i.e., the engineering pipeline is complicated and the engineering pre-fabrication is poor. Thus, the first compressor 202 uses a first oil-free compressor and the second compressor 302 uses a second oil-free compressor in the embodiment of the present disclosure. In this way, the refrigeration system does not need to consider the pipe length and the height difference, which can simplify the engineering pipeline, save costs and accelerate the delivery speed.

Figure 4:
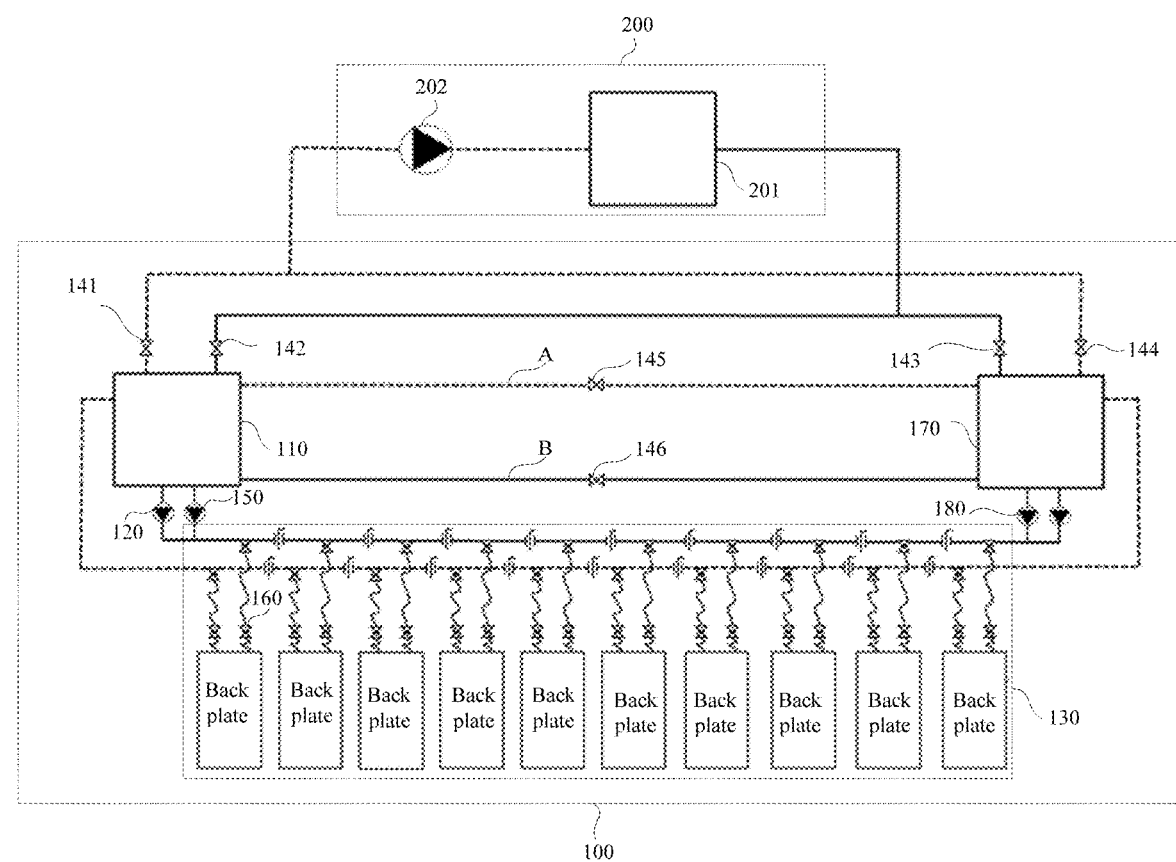
FIG. 4 is a schematic view of an indoor module according to an embodiment of the present disclosure.

FIG. 4 is a schematic view of an indoor module provided by an embodiment of the present disclosure.

As shown in FIG. 4, the indoor module 100 according to the embodiment of the present disclosure includes a first gas-liquid separator 110, a first refrigerant pump 120, and an evaporator 130. The evaporator 130 adopts a form of a back plate so as to increase the heat exchange area, and the back plate is attached to the cabinet to be cooled which is arranged in the room of the data center, so as to achieve the close cooling and improve the overall heat exchange effect, thereby improving the refrigeration effect of the whole refrigeration system. The evaporator 130 may also use a conventional heat exchanger with a copper tube and an aluminum fin. The evaporator 130 may also employ a microchannel heat exchanger in the field of vehicle air conditioners. A liquid inlet of the first gas-liquid separator 110 is connected to the liquid refrigerant outlets of the first condenser 201 and the second condenser 202, respectively. A liquid outlet of the first gas-liquid separator 110 is connected to an inlet of the first refrigerant pump 120, and an outlet of the first refrigerant pump 120 is connected to an inlet of the back plate. A gas inlet of the first gas-liquid separator 110 is connected to an outlet of the back plate, and a gas outlet of the first gas-liquid separator 110 is connected to the inlets of the first compressor 202 and the second compressor 302, respectively.

In this embodiment, the liquid refrigerant flowing out from the liquid refrigerant outlet of the first condenser 201 or the liquid refrigerant outlet of the second condenser 202 flows to the first gas-liquid separator 110 to have a gas-liquid separation (since a small amount of gaseous refrigerant may exist in the liquid refrigerant flowing out from the liquid refrigerant outlet of the first condenser 201 or the liquid refrigerant outlet of the second condenser 202, the gas-liquid separation needs to be performed by the first gas-liquid separator 110), and the liquid refrigerant obtained after the gas-liquid separation is sent to the evaporator 130 by the first refrigerant pump 120. After the heat exchange with the evaporator 130, the liquid refrigerant changes into the gaseous refrigerant, flows into the first gas-liquid separator 110 again, and has the gas-liquid separation again through the first gas-liquid separator 110 (since the liquid refrigerant changes into the gaseous refrigerant after the heat exchange with the evaporator 130, and a small amount of liquid refrigerant may exist in the gaseous refrigerant, the gas-liquid separation needs to be performed by the first gas-liquid separator 110), then the gaseous refrigerant flows out, and the flowing-out gaseous refrigerant flows to the first compressor 202 via the inlet of the first compressor 202, or flows to the second compressor 302 via the inlet of the second compressor 302.

As shown in FIG. 4, a first throttle valve 141 is provided in a communication pipeline between the gas outlet of the first gas-liquid separator 110 and the inlet of the first compressor 202. A second throttle valve 142 is provided in a communication pipeline between the liquid refrigerant outlet of the first condenser 201 and the liquid inlet of the first gas-liquid separator 110. A third throttle valve (not shown) is provided in a communication pipeline between the gas outlet of the first gas-liquid separator 110 and the inlet of the second compressor 302. A fourth throttle valve (not shown) is provided in a communication pipeline between the liquid refrigerant outlet of the second condenser and the liquid inlet of the first gas-liquid separator.

In this embodiment, the first throttle valve 141, the second throttle valve 142, the third throttle valve and the fourth throttle valve each may be an electronic expansion valve. In the electronic expansion valve, an electric signal generated by an adjusted parameter is used to control a voltage or a current applied to the expansion valve, thereby achieving the purpose of adjusting a liquid supply amount. The refrigeration system has a wide adjustment range of the cooling liquid supply amount, which requires a fast adjustment response. It is difficult for the traditional throttling device (such as a thermal expansion valve) to be well competent for this, while the electronic expansion valve can meet the requirement well, that is, in the refrigeration process, the electronic expansion valve has the fast adjustment response, which can improve the refrigeration efficiency.

In order to allow more refrigerant to flow out of the first gas-liquid separator 110 faster, the first gas-liquid separator 110 is provided with a plurality of liquid outlets and a plurality of first refrigerant pumps, in which the liquid outlets have a one-to-one correspondence with the first refrigerant pump. For example, as shown in FIG. 4, the first gas-liquid separator 110 is provided with two liquid outlets and two first refrigerant pumps 120 and 150.

As shown in FIG. 4, a shut-off valve 160 is provided in a communication pipeline between the outlets of the first refrigerant pumps 120 and 150 and the inlet of the back plate. The shut-off valve 160 is controlled to be opened when the cabinet to be cooled in the room of the data center needs to be cooled. The shut-off valve 160 may be controlled to be shut off when the cabinet to be cooled in the room of the data center does not need to be cooled. The number of the shut-off valves 160 may be one or two, and the specific number is not limited by the present disclosure.

As shown in FIG. 4, in addition to the shut-off valve 160 arranged in the communication pipeline between the outlets of the first refrigerant pumps 120 and 150 and the inlet of the back plate, a shut-off valve may also be provided between the outlet of the back plate and a gaseous refrigerant inlet of the first gas-liquid separator 110, the number of the shut-off valves may also be one or two, and the specific number is not limited by the present disclosure.

In order to speed up the separation of the liquid refrigerant and the gaseous refrigerant, and in order to consider the refrigeration cold source of the indoor module 100 during the starting time at the moment of the machine switching because of failure, as shown in FIG. 4, in the embodiment of the present disclosure, the indoor module 100 is further provided with a second gas-liquid separator 170, which is correspondingly provided with a second refrigerant pump 180. A liquid inlet of the second gas-liquid separator 170 is connected (e.g. via a throttle valve 143) to the liquid refrigerant outlets of the first condenser 201 and the second condenser 301, respectively. A liquid outlet of the second gas-liquid separator 170 is connected to an inlet of the second refrigerant pump 180, and an outlet of the second refrigerant pump 180 is connected to the inlet of the back plate. A gas inlet of the second gas-liquid separator 170 is connected to the outlet of the back plate, and a gas outlet of the second gas-liquid separator 170 is connected (e.g. via a throttle valve 144) to the inlets of the first compressor 202 and the second compressor 302, respectively.

In order to allow more refrigerant to flow out of the second gas-liquid separator 170 faster, the second gas-liquid separator 170 is provided with a plurality of the liquid outlets and a plurality of the second refrigerant pumps, in which the liquid outlets have a one-to-one correspondence with the second refrigerant pump. For example, as shown in FIG. 4, the second gas-liquid separator 170 is provided with two liquid outlets and two second refrigerant pumps.

As shown in FIG. 4, the first gas-liquid separator 110 is connected to the second gas-liquid separator 170 through a communication pipe A, i.e. a refrigerant gas pipe, and a communication pipe B, i.e. a refrigerant liquid pipe. Thus, when either one of the first gas-liquid separator 110 and the second gas-liquid separator 170 is damaged, the refrigerant in the gas-liquid separator on the damaged side can flow to the gas-liquid separator on the non-damaged side through the communication pipe A (i.e. the refrigerant gas pipe) and the communication pipe B (i.e. the refrigerant liquid pipe), so that the amount of the refrigerant can be ensured to ensure the cooling capacity of the indoor module.

As shown in FIG. 4, the communicating pipe A (i.e. the refrigerant gas pipe) is provided with a fifth throttle valve 145, and the communicating pipe B (i.e. the refrigerant liquid pipe) is provided with a sixth throttle valve 146.

In this embodiment, the fifth throttle valve 145 and the sixth throttle valve 146 each may be an electronic expansion valve. In the electronic expansion valve, an electric signal generated by an adjusted parameter is used to control a voltage or a current applied to the expansion valve, thereby achieving the purpose of adjusting a liquid supply amount. The refrigeration system has a wide adjustment range of the cooling liquid supply amount, which requires a fast adjustment response. It is difficult for the traditional throttling device (such as a thermal expansion valve) to be well competent for this, while the electronic expansion valve can meet the requirement well, that is, in the refrigeration process, the electronic expansion valve has the fast adjustment response, which can improve the refrigeration efficiency.

In summary, in the refrigeration system for the data center according to the embodiment of the present disclosure, the auxiliary outdoor heat-dissipation module is provided, the main outdoor heat-dissipation module includes the first compressor and the first condenser, the auxiliary outdoor heat-dissipation module includes the second compressor and the second condenser, the inlets of the first compressor and the second compressor are respectively connected with the outlet of the indoor module, the outlets of the first compressor and the second compressor are respectively connected with the gaseous refrigerant inlet of the first condenser, and the liquid refrigerant outlets of the first condenser and the second compressor are respectively connected with the inlet of the indoor module, so that the refrigeration cycle passage for the data center is formed by the indoor module, the first condenser and the first compressor when the main outdoor heat-dissipation module is in the normal condition, and the refrigeration cycle passage for the data center is formed by the indoor module, the second condenser and the second compressor when the main outdoor heat-dissipation module fails. Thus, the refrigeration system for the data center of the present disclosure can switch to refrigerate with the auxiliary outdoor heat-dissipation module when the main outdoor heat-dissipation module fails, so that the main outdoor heat-dissipation module which fails can be switched out for maintenance, thereby ensuring that no hot spots occur to the cabinet in the whole process, and hence achieving the continuous refrigeration of the system. The refrigeration system uses the system including the compressor, which can meet the requirements for the application scenarios of the data center, reduce the energy consumption of the refrigeration system for the data center, and improve the energy saving of the refrigeration system for the data center. The compressor uses the oil-free compressor, which can simplify the air conditioning system for the data center, save costs, improve the engineering pre-fabrication, and accelerate the delivery speed.

The above specific embodiments are not intended to be construed as limiting the scope of the present disclosure. It will be apparent to those skilled in the art that various modifications, combinations, sub-combinations and substitutions can be made depending on design requirements and other factors. Any modifications, equivalent replacements and improvements made within the spirit and principle of the present disclosure shall fall into the scope of the present disclosure.

The invention claimed is:

1. A refrigeration system for a data center, the data center comprising a cabinet in a room thereof, the system comprising:
an indoor module;
a main outdoor heat-dissipation module comprising a first condenser and a first compressor, wherein an inlet of the first compressor is connected to an outlet of the indoor module, an outlet of the first compressor is connected to a gaseous refrigerant inlet of the first condenser, and a liquid refrigerant outlet of the first condenser is connected to an inlet of the indoor module; and
an auxiliary outdoor heat-dissipation module comprising a second condenser and a second compressor, wherein an inlet of the second compressor is connected to the outlet of the indoor module, an outlet of the second compressor is connected to a gaseous refrigerant inlet of the second condenser, and a liquid refrigerant outlet of the second condenser is connected to the inlet of the indoor module,
wherein a refrigeration cycle passage for the data center is formed by the indoor module, the first condenser and the first compressor when the main outdoor heat-dissipation module is in a normal condition,
the refrigeration cycle passage for the data center is formed by the indoor module, the second condenser and the second compressor when the main outdoor heat-dissipation module fails;
wherein the indoor module comprises a first gas-liquid separator, a first refrigerant pump and an evaporator, the evaporator comprises a back plate, and the back plate is attached to the cabinet to be cooled which is arranged in the room of the data center,
wherein a liquid inlet of the first gas-liquid separator is connected to the liquid refrigerant outlets of the first condenser and the second condenser, respectively,
a liquid outlet of the first gas-liquid separator is connected to an inlet of the first refrigerant pump, and an outlet of the first refrigerant pump is connected to an inlet of the back plate,
a gas inlet of the first gas-liquid separator is connected to an outlet of the back plate, and a gas outlet of the first gas-liquid separator is connected to the inlets of the first compressor and the second compressor, respectively;
wherein the indoor module further comprises a second gas-liquid separator and a second refrigerant pump,
wherein a liquid inlet of the second gas-liquid separator is connected to the liquid refrigerant outlets of the first condenser and the second condenser, respectively,
a liquid outlet of the second gas-liquid separator is connected to an inlet of the second refrigerant pump, and an outlet of the second refrigerant pump is connected to the inlet of the back plate,
a gas inlet of the second gas-liquid separator is connected to the outlet of the back plate, and a gas outlet of the second gas-liquid separator is connected to the inlets of the first compressor and the second compressor, respectively.

2. The refrigeration system according to claim 1, wherein the first compressor is a first oil-free compressor and the second compressor is a second oil-free compressor.

3. The refrigeration system according to claim 1, wherein a throttle valve is arranged in a communication pipeline between the gas outlet of the first gas-liquid separator and the inlet of the first compressor.

4. The refrigeration system according to claim 1, wherein a throttle valve is arranged in a communication pipeline between the liquid refrigerant outlet of the first condenser and the liquid inlet of the first gas-liquid separator.

5. The refrigeration system according to claim 1, wherein a throttle valve is arranged in a communication pipeline between the gas outlet of the first gas-liquid separator and the inlet of the second compressor.

6. The refrigeration system according to claim 1, wherein a throttle valve is arranged in a communication pipeline between the liquid refrigerant outlet of the second condenser and the liquid inlet of the first gas-liquid separator.

7. The refrigeration system according to claim 1, wherein a plurality of the liquid outlets are provided, a plurality of the first refrigerant pumps are provided, and the liquid outlets have a one-to-one correspondence with the first refrigerant pump.

8. The refrigeration system according to claim 1, wherein a shut-off valve is arranged in a communication pipeline between the outlet of the first refrigerant pump and the inlet of the back plate.

9. The refrigeration system according to claim 1, wherein the first gas-liquid separator is connected to the second gas-liquid separator via a refrigerant gas pipe and a refrigerant liquid pipe.

10. The refrigeration system according to claim 9, wherein a first throttle valve is arranged in the refrigerant gas pipe, and a second throttle valve is arranged in the refrigerant liquid pipe.

* * * * *